Figure 1:
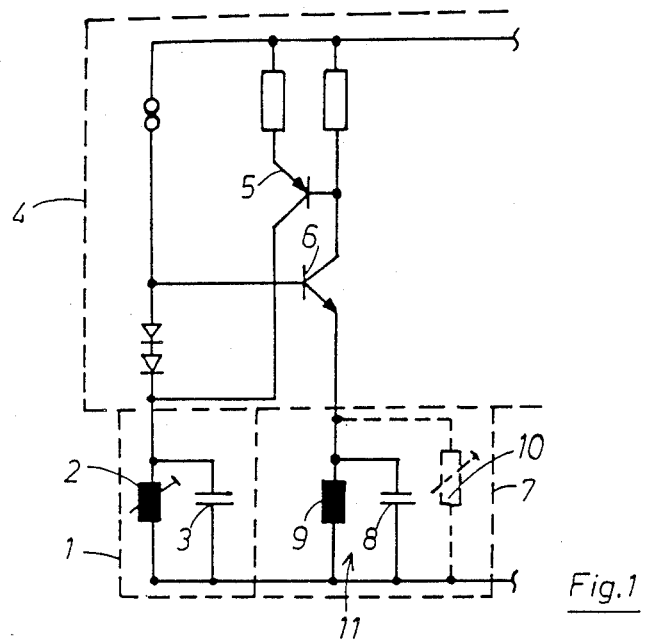

United States Patent [19]

Tigges et al.

[11] Patent Number: 4,879,531
[45] Date of Patent: Nov. 7, 1989

[54] INDUCTIVE PROXIMITY SWITCH OSCILLATOR HAVING SAME ACTIVATING RANGE FOR FERROUS AND NONFERROUS METALS

[75] Inventors: Burkhard Tigges, Sundern; Dierk Brasse, Schalksmuehle, both of Fed. Rep. of Germany

[73] Assignee: Werner Turck GmbH & Co., KG, Halver, Fed. Rep. of Germany

[21] Appl. No.: 188,220

[22] Filed: Apr. 29, 1988

[30] Foreign Application Priority Data

Apr. 30, 1987 [DE] Fed. Rep. of Germany ....... 3714433

[51] Int. Cl.⁴ .................. H03K 17/95; G01V 3/10
[52] U.S. Cl. ............................. 331/65; 324/327; 324/236; 331/117 R
[58] Field of Search ............ 331/65, 117 R; 324/327, 324/236

[56] References Cited

U.S. PATENT DOCUMENTS

| 3,601,691 | 8/1971 | Gardiner | 324/327 |
| 4,513,257 | 4/1985 | Miyamoto et al. | 331/65 |
| 4,719,362 | 1/1988 | Nest et al. | 331/65 X |

FOREIGN PATENT DOCUMENTS

| 1302191 | 1/1971 | Fed. Rep. of Germany | 331/65 |
| 2713151 | 9/1978 | Fed. Rep. of Germany | 331/65 |
| 2827951 | 6/1979 | Fed. Rep. of Germany | 324/236 |
| 3714433 | 11/1988 | Fed. Rep. of Germany | 331/65 |

OTHER PUBLICATIONS

Donner, "Position Detector", IBM Technical Disclosure Bulletin, vol. 6, No. 5, Oct. 1963, pp. 24-25.

Primary Examiner—Siegfried H. Grimm
Attorney, Agent, or Firm—Antonelli, Terry & Wands

[57] ABSTRACT

An inductive proximity switch including an oscillator circuit with a frequency resonant circuit (1) determining the frequency and with an impedance member (7) determining the amplification, this impedance member containing an impedance resonant circuit with a sensor coil (9) that can be influenced by the approach of a metallic trigger. In order to provide that the proximity switch has the same activating range for ferrous and nonferrous trigger metals, the resonant frequency ($f_o$) of the frequency resonant circuit (1) and the critical impedance value ($Z_o$) of the impedance member (7) are tuned, according to this invention, to the coordinates ($f_o, Z_o$) of the point of intersection ($P_o$) of the impedance/frequency characteristics (II, III), resulting for respectively identical activating range, for an NF trigger and for an FE trigger.

8 Claims, 3 Drawing Sheets

INDUCTIVE PROXIMITY SWITCH OSCILLATOR HAVING SAME ACTIVATING RANGE FOR FERROUS AND NONFERROUS METALS

The invention relates to an inductive proximity switch consisting of an oscillator circuit with a frequency resonant circuit determining the frequency and with an impedance member determining the amplification. This impedance member contains an impedance resonant circuit with a sensor coil responsive to the approach of a metallic trigger. Also included is, an evaluating circuit that derives the switching conditions of the proximity switch from the òscillation condition and, respectively, tho oscillation amplitude. The oscillation condition of the oscillator circuit changes at a critical impedance value of the impedance member associated with the switching distance of the trigger, i.e. at a critical amplification factor.

In the conventional, known proximity switches (German Patent No. 2,827,951), the sensor coil is connected in the resonant circuit determining the frequency of the oscillator. In such proximity switches, the response sensitivity to nonferrous metals, such as aluminum, copper, called NF metals hereinbelow, differs from the response sensitivity to ferrous metals or ferromagnetic metals, called FE metals hereinbelow. As a result, there are differing switching distances for the respective trigger metals; for this reason, under practical conditions, separate proximity switches must be produced for the various materials if these switches are to exhibit coincident switching range.

Furthermore, inductive proximity switches have been known (prospectus "Naeherungsschalter 1 H 1" [Proximity Switch 1 H 1] Issue 11/82, by the company Hans Turck GmbH & Co. KG, Mülheim/Ruhr) wherein the oscillator circuit includes, besides the frequency-determining resonant circuit that cannot be affected externally, still another series resonant circuit connected as the impedance member of the oscillator circuit, and the inductive member of which is constituted by the sensor coil affectable by a trigger. In the proximity switch of the type under consideration, the impedance value and thus the amplification factor of the oscillator circuit is altered by the approach of a metallic trigger. This proximity switch is designed so that, at the desired switching range, the critical impedance or the critical amplification factor is exceeded at which the oscillation condition of the oscillator circuit changes. In these conventional proximity switches, use is made of the differing response sensitivity to FE or NF metals to manufacture so-called selective proximity switches which thus respond in each case only to either FE or NF metal. Therefore, when using such proximity switches it is possible, for example, to count separately aluminum cans and iron cans traveling in mixed fashion on an assembly line past the switches.

The invention is based on the object of providing an inductive proximity switch recognizing FE metals as well as NF metals with substantially identical response sensitivity and exhibiting in both cases the same activating range.

Starting with a proximity switch of this type, this object has been attained according to the present invention by tuning the resonant frequency of the frequency resonant circuit and the critical impedance value of the impedance member to the coordinates of the point of intersection of the impedance/frequency characteristics, resulting in the same switching range for an NF trigger and for an FE trigger, respectfully.

The invention is based on the realization that, especially in high-quality resonant circuits, e.g. 100 or more, the impedance/frequency characteristics for NF and FE triggers located at the desired switching range intersect. This point of intersection is associated with a specific frequency and a specific impedance. According to the invention, the natural frequency of the frequency-determining frequency resonant circuit is adjusted to this frequency value. Then, the critical impedance of the oscillator circuit is set to the impedance value of this point of intersection; for this purpose, a separate adjusting member can be provided in the impedance branch of the oscillator circuit. Under practical conditions it is also possible to utilize an impedance resonant circuit, the impedance of which in the intersection corresponds originally to the critical impedance of the oscillator circuit so that subsequent adjustment is no longer required.

If the point of intersection—based on the impedance/frequency characteristic in the case of an unaffected resonant circuit—is located in the nonresonant range thereof, then according to the invention a proximity switch is created which does not oscillate in the unaffected condition and which builds up to oscillation upon the approach of an NF as well as FE trigger to a certain switching distance. If, in contrast thereto, the determined point of intersection—again based on the characteristic curve of the unaffected resonant circuit—lies outside of the nonresonant range, then according to the invention a proximity switch results, the oscillator of which oscillates in the unaffected condition and is damped in supercritical fashion by the approach of the NF or FE trigger.

According to additional features of the invention, the frequency resonant circuit and the impedance resonant circuit can advantageously consist of the same components, and the resonant circuits can be designed to be mechanically identical. Thereby, a coincident behavior under temperature changes is ensured.

Figure 4:
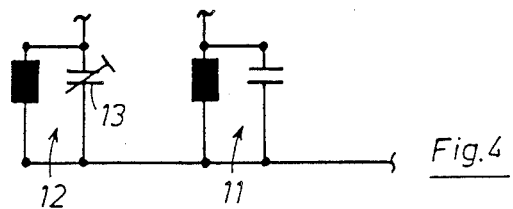
Figure 5:
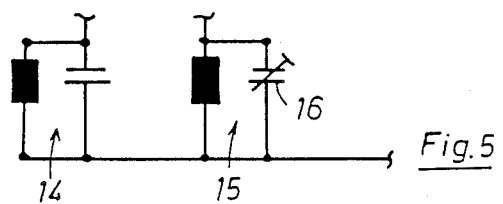
Figure 3:
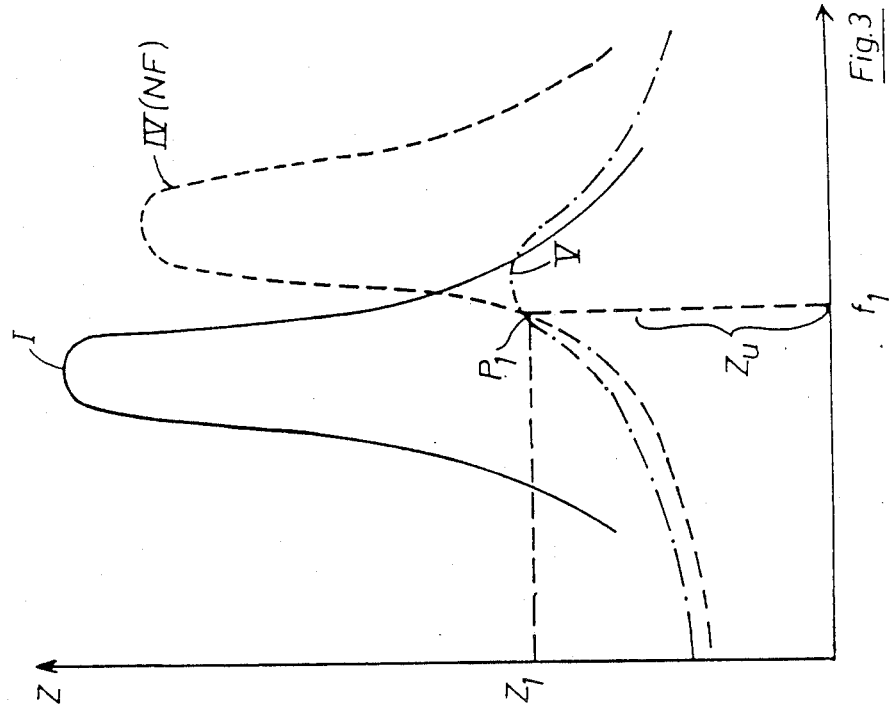
Figure 2:
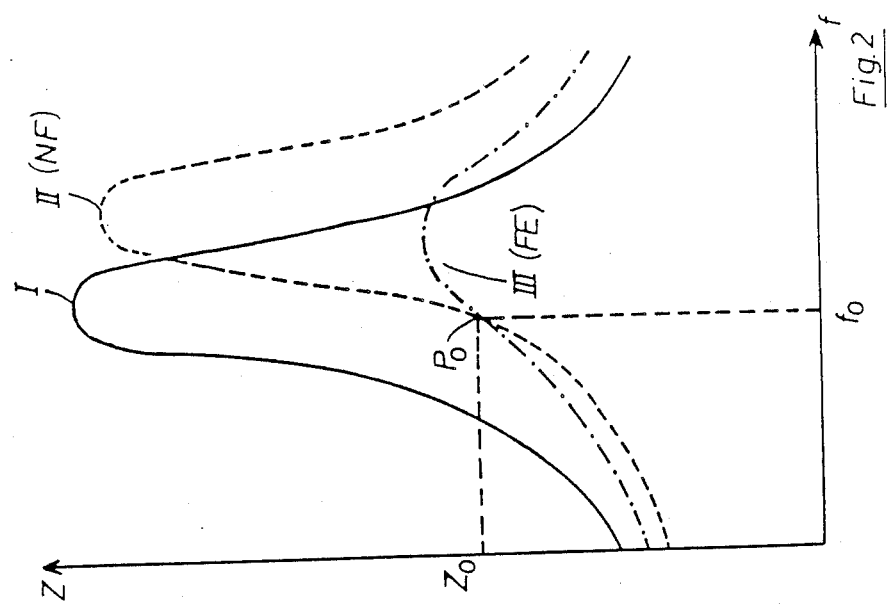
Figure 6:
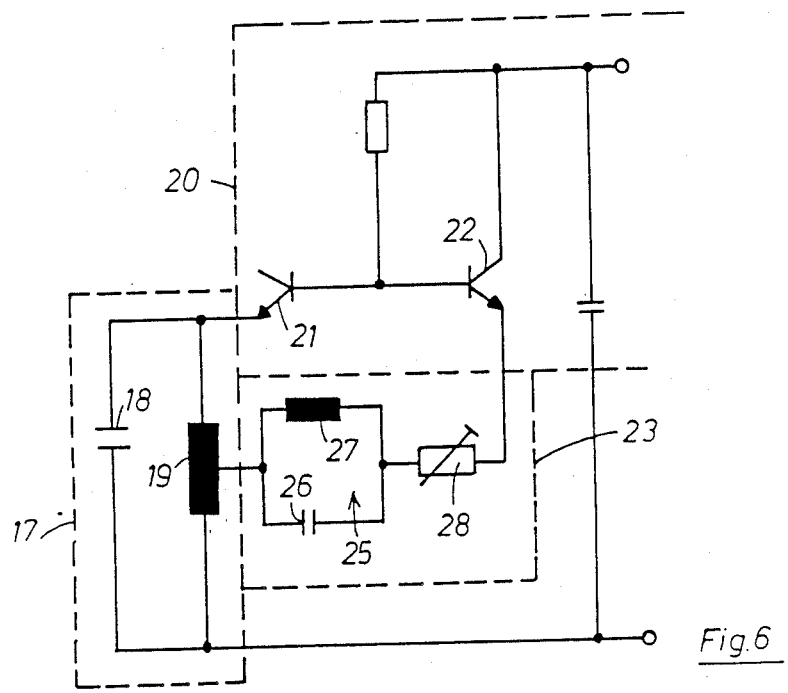
Figure 7:
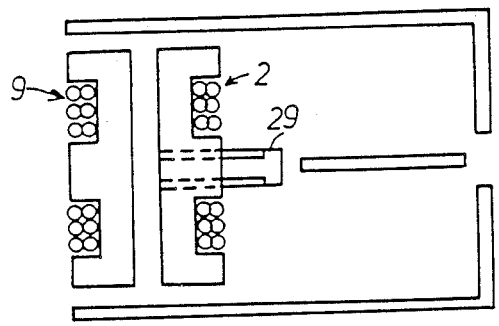
Figure 8:
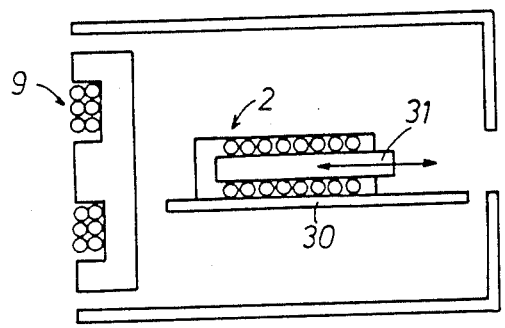

Additional features of the invention are indicated in the dependent claims and will be described in greater detail below with reference to several embodiments illustrated in the drawings wherein:

FIG. 1 shows the oscillator circuit of a proximity switch according to a first embodiment of the invention, FIG. 2 is a diagram to explain the characteristics of the impedance member of the oscillator circuit of FIG. 1, based on a first desired switching range, FIG. 3 is a diagram analogous to FIG. 2, but based on a second switching range, FIG. 4 is a modified embodiment of the frequency-determining resonant circuit in the circuit arrangement of FIG. 1, FIG. 5 is a modified form of the impedance resonant circuit according to FIG. 1, FIG. 6 is another embodiment of an oscillator circuit of a proximity switch according to the invention, FIG. 7 shows a schematic, graphic representation of the coils of the two resonant circuits according to FIG. 1, and FIG. 8 is a graphic illustration of the coil arrangement according to FIG. 1, modified as compared with FIG. 7.

The oscillator circuit illustrated in FIG. 1 consists of a frequency-determining frequency resonant circuit 1 with coil 2 and capacitor 3, of a two-stage amplifier circuit 4 with the two transistors 5 and 6, and of an impedance member 7 determining the amplification factor.

The impedance member 7 comprises a capacitor 8 and a coil 9 which latter is the sensor coil that can be affected by a metallic trigger. The impedance member 7 can also include—as indicated in dashed lines—an adjustable resistor 10 which in this circuit is connected in parallel to the impedance resonant circuit 11 formed by the capacitor 8 and the sensor coil 9, but which can also be connected in series.

The oscillator circuit according to FIG. 1 is tuned in such a way that, at equal distance of an NF trigger and an FE trigger, the impedance of the impedance resonant circuit 11 is brought to the critical impedance value which, when exceeded, causes the oscillator circuit to change its oscillation condition. At the same time, the resonant frequency of the frequency resonant circuit 1 is set to the frequency pertaining to this critical impedance value; this will be explained hereinbelow, with reference to the diagrams of FIGS. 2 and 3, in greater detail.

In FIG. 2, the impedance/frequency characteristics of the impedance resonant circuit 11 are illustrated, the curve I representing the unaffected condition. The curve II concerns the case wherein an NF trigger is located at a distance of 20 millimeters from the sensor coil 9. The characteristic curve III is for the case wherein an FE trigger lies at a spacing of 20 millimeters in front of the sensor coil 9. As can be seen, the curves II and III intersect in a point $P_o$ to which pertain coordinates $f_o$ and $Z_o$. In the oscillator circuit according to FIG. 1, the coil 2 of the frequency resonant circuit 1 is adjusted so that the frequency resonant circuit 1 has the resonant frequency $f_o$. The impedance of the impedance member 7 is simultaneously adjusted to this critical impedance $Z_o$. The latter adjustment can be performed, as indicated in dashed lines in FIG. 1, for example by means of the variable resistor 10. Alternatively, it is also possible to immediately select an impedance resonant circuit 11, the impedance of which at resonant frequency $f_o$ is initially equal to the critical impedance value $Z_o$. The point of intersection $P_o$ lies, based on curve I for the unaffected condition, within the region of curve I lying above the critical impedance $Z_o$ at which, therefore, the oscillator of the proximity switch does not oscillate when unaffected. Upon the approach of a metal trigger to the desired activating range of, in this instance, 20 millimeters, the oscillation of the oscillator circuit commences independently of whether an NF trigger or an FE trigger approaches.

FIG. 3, in turn, shows the curve I for the unaffected condition and curves IV and V for the cases wherein, on the one hand, an NF trigger and, on the other hand, an FE trigger is arranged at a distance of 15 millimeters from the sensor coil 9. Here again, the curves IV and V intersect in a point of intersection $P_1$ having the coordinates $f_1$ and $Z_1$. Thus, if a proximity switch is to be manufactured for an activating range of 15 millimeters, the natural frequency of the frequency resonant circuit 1 in the oscillator circuit of FIG. 1 is set to this frequency $f_1$, and the impedance of the impedance member 7 is adjusted to this critical impedance value $Z_1$.

FIG. 4 shows, as a fragmentary view of the circuit, the impedance resonant circuit 11 according to FIG. 1, as well as a modified embodiment of the frequency resonant circuit 12 wherein the capacitor 13 is designed as a trimmer capacitor so that tuning to the resonant frequency $f_o$ and, respectively, $f_1$ is effected at capacitor 13.

FIG. 5 illustrates another modifying possibility of the two resonant circuits. The frequency-determining resonant circuit 14 is not adjustable in this arrangement. Instead, the impedance resonant circuit 15 has a trimmer capacitor 16. Thus, in this case the resonant frequency of the resonant circuit 14 is fixedly predetermined, and by adjusting the trimmer capacitor 16, the point of intersection $P_o$ or $P_1$ according to the diagrams of FIGS. 2 and 3 is shifted toward this predetermined resonant frequency.

FIG. 6 shows an alternative embodiment for the oscillator circuit, in this instance likewise consisting of a frequency-determining parallel resonant circuit 17 with capacitor 18 and coil 19, an amplifier circuit 20 with the two transistors 21, 22, and of an impedance member 23. The impedance member 23 consists of an impedance parallel resonant circuit 25 with capacitor 26 and coil 27 and of an adjustable resistor 28 connected in series with the impedance resonant circuit 25. The impedance member 23 is connected to a central tap of the coil 19. The coil 27 of the impedance resonant circuit 25 in this case constitutes the sensor coil that can be influenced by an external trigger.

FIG. 7 shows the structure of the sensor coil 9 of the impedance resonant circuit 11 and of the coil 2 pertaining to the frequency resonant circuit 1 of FIG. 1, in a graphic representation. Both coils have respective equal pot cores and are mechanically of substantially the same structure. In case of coil 2, an adjustable threaded core 29 is provided.

In the embodiment of FIG. 8, the coil 2 of the frequency-determining resonant circuit 1 is arranged on a printed circuit board 30. The coil has a plunger-type core 31 that can be introduced to a greater or lesser extent and is used to effect the tuning step.

In all illustrated embodiments, the frequency and impedance resonant circuits consist each of parallel resonant circuits. However, it is likewise possible to design these resonant circuits as series resonant circuits.

We claim:

1. Inductive proximity switch comprising an oscillator circuit with a frequency resonant circuit determining a frequency of oscillation of the oscillator circuit and an impedance member determining an amplification factor of the oscillator circuit, the impedance member containing an impedance resonant circuit with a sensor coil responsive to the approach of a metallic trigger, wherein the oscillation condition of the oscillator circuit changes at a critical impedance value of the impedance member associated with a switching distance of the trigger, such that the resonant frequency of the frequency resonant circuit and the critical impedance value of the impedance member are tuned to the coordinates of a point of intersection of the impedance/frequency characteristics of the oscillator circuit, resulting in the same switching distance for a nonferrous trigger and for a ferrous trigger.

2. Proximity switch according to claim 1, wherein the frequency resonant circuit and the impedance resonant circuit are of high quality.

3. Proximity switch according to claim 1, wherein the frequency resonant circuit and the impedance resonant circuit are comprised of identical components and are mechanically of identical design.

4. Proximity switch according to claim 1, wherein the frequency resonant circuit and the impedance resonant circuit each are parallel resonant circuits.

5. Proximity switch according to claim 1, wherein an inductance of a coil of the frequency resonant circuit is adjustable.

6. Proximity switch according to claim 1, wherein a capacitance of a capacitor of the frequency resonant circuit is adjustable.

7. Proximity switch according to claim 1, wherein a capacitance of a capacitor of the impedance resonant circuit is adjustable.

8. Proximity switch according to claim 1, wherein the impedance member has an adjustable resistor.

* * * * *